United States Patent
Luo et al.

(10) Patent No.: US 7,764,536 B2
(45) Date of Patent: Jul. 27, 2010

(54) METHOD AND SYSTEM FOR PROVIDING A SENSE AMPLIFIER AND DRIVE CIRCUIT FOR SPIN TRANSFER TORQUE MAGNETIC RANDOM ACCESS MEMORY

(75) Inventors: Xiao Luo, Cupertino, CA (US); David Chang-Cheng Yu, Pleasanton, CA (US)

(73) Assignees: Grandis, Inc., Milpitas, CA (US); Renesas Technology Corp., Tokyo (JP)

( * ) Notice: Subject to any disclaimer, the term of this patent is extended or adjusted under 35 U.S.C. 154(b) by 216 days.

(21) Appl. No.: 11/834,917

(22) Filed: Aug. 7, 2007

(65) Prior Publication Data

US 2009/0040855 A1  Feb. 12, 2009

(51) Int. Cl.
*G11C 11/00* (2006.01)

(52) U.S. Cl. .............. 365/158; 365/157; 365/148; 365/171; 365/173; 365/97

(58) Field of Classification Search ............ 365/158, 365/157, 148, 171, 173, 97
See application file for complete search history.

(56) References Cited

U.S. PATENT DOCUMENTS

| | | | |
|---|---|---|---|
| 5,301,152 A * | 4/1994 | Iwashita | ............... 365/190 |
| 6,724,653 B1 | 4/2004 | Iwata et al. | |
| 6,795,336 B2 | 9/2004 | Kim et al. | |
| 6,822,895 B2 | 11/2004 | Yamada | |
| 6,826,663 B2 | 11/2004 | Perego et al. | |
| 6,876,575 B2 | 4/2005 | Hidaka | |
| 7,215,175 B1 * | 5/2007 | Mandal et al. | ............... 327/525 |
| 2006/0279981 A1 | 12/2006 | Diao et al. | |
| 2007/0211523 A1 * | 9/2007 | Kim | ............... 365/158 |

OTHER PUBLICATIONS

PCT International Search Report and Written Opinion of the International Searching Authority, issued Nov. 4, 2008, application No. PCT/US08/72289.
T. Kawahara, et al., "2Mb Spin-Transfer Torque RAM (SPRAM) with Bit-by-Bit Bidirectional Current Write and Parallelizing-Direction Current Read", IEEE International Solid State Circuit Conference, Feb. 2007, pp. 480-481.

(Continued)

*Primary Examiner*—VanThu Nguyen
*Assistant Examiner*—Eric Wendler
(74) *Attorney, Agent, or Firm*—Convergent Law Group LLP

(57) ABSTRACT

A method and system for providing a magnetic memory are described. The method and system include a plurality of magnetic storage cells, a plurality of bit lines, at least one reference line, and at least one sense amplifier. Each magnetic storage cell includes magnetic element(s) and selection device(s). The magnetic element(s) are programmable using write current(s) driven through the magnetic element. The bit and source lines correspond to the magnetic storage cells. The sense amplifier(s) are coupled with the bit lines and reference line(s), and include logic and a plurality of stages. The stages include first and second stages. The first stage converts at least current signal to at least one differential voltage signal. The second stage amplifies the at least one differential voltage signal. The logic selectively disables at least one of the first and second stages in the absence of a read operation and enabling the first and second stages during the read operation.

30 Claims, 9 Drawing Sheets

OTHER PUBLICATIONS

Dietmar Gogl, et al., "A 16-Mb MRAM Featuring Bootstrapped Write Drivers", IEEE Journal of Solid-State Circuits, vol. 40, No. 4, Apr. 2005, pp. 902-908.

Thomas W. Andre, et al., "A 4-Mb 0.18-μm 1T1MTJ Toggle MRAM With Balanced Three Input Sensing Scheme and Locally Mirrored Unidirectional Write Drivers", IEEE Journal of Solid-State Circuits, vol. 40, No. 1, Jan. 2005, pp. 301-309.

Takaharu Tsuji, et al., "A 1.2V 1Mbit embedded MRAM Core with Folded Bit-Line Array Architecture", Digest of Technical Papers, IEEE Symposium on VLSI Circuits, Jun. 2004, pp. 450-453.

John DeBrosse, et al., "A High-Speed 128-kb MRAM Core for Future Universal Memory Application", IEEE Journal of Solid-State Circuits, vol. 39, No. 4, Apr. 2004, pp. 678-683.

* cited by examiner

METHOD AND SYSTEM FOR PROVIDING A SENSE AMPLIFIER AND DRIVE CIRCUIT FOR SPIN TRANSFER TORQUE MAGNETIC RANDOM ACCESS MEMORY

BACKGROUND OF THE INVENTION

FIG. 1 depicts a small portion of a conventional spin transfer torque magnetic random access memory (STT-MRAM) 1. The conventional STT-MRAM 1 utilizes spin transfer as a mechanism for switching the state of the magnetic storage cell. The conventional STT-MRAM 1 includes a conventional magnetic memory cell 10 including a magnetic element 12 and a selection device 14. The selection device 14 is generally a transistor such as a NMOS transistor and includes a drain 11, a source 13, and a gate 15. Also depicted are a word line 16, a bit line 18, and source line 20. The word line 16 is oriented perpendicular to the bit line 18. The source line 20 is typically either parallel or perpendicular to the bit line 18, depending on specific architecture used for the conventional STT-MRAM 1. However, in other STT-MRAMs, the orientations of bit lines, word lines, and source lines may differ. The bit line is connected to the magnetic element 12, while the source line 20 is connected to the source 13 of the selection device 14. The word line 16 is connected to the gate 15.

The conventional STT-MRAM 1 programs the magnetic memory cell 10 by current flowing through the cell. In particular, the magnetic element 12 is configured to be changeable between high and low resistance states by driving a current through the conventional magnetic element 12. The current is spin polarized when passing through the magnetic element 12 and changes the state of the magnetic element 12 by the spin transfer effect. For example, the magnetic element 12 may be a MTJ configured to be written using the spin transfer effect. Typically, this is achieved by ensuring that the magnetic element 12 has, for example, a sufficiently small cross-sectional area as well as other features desirable for switching using the spin transfer effect. When the current density is sufficiently large, the current carriers driven through the magnetic element 12 may impart sufficient torque to change the state of the magnetic element 12. When the write current is driven in one direction, the state may be changed from a low resistance state to a high resistance state. When the write current is passes through the magnetic element 12 in the opposite direction, the state may be changed from a high resistance state to a low resistance state.

During write operations, the word line 16 is high and turns on the selection device 14. The write current flows either from the bit line 18 to the source line 20, or vice versa, depending upon the state to be written to the magnetic memory cell 10. During read operations, the word line 86 is high, thereby enabling the selection device 14. Consequently, a read current flows from the bit line 18 to the source line 20.

Because the magnetic element 12 is programmed by a current driven through the magnetic element 12, the conventional STT-MRAM 1 has better cell scalability, lower current of writing memory cells 80, does not suffer from the problem of write disturbance to the neighboring memory cells and smaller cell size for high memory density.

FIG. 2 depicts the structure of another conventional STT-RAM memory array block 1' that utilizes the conventional memory cell 10 (depicted in FIG. 2 as cell 10'). Portions of the conventional STT-RAM memory block 1' are analogous to those depicted in FIG. 1 and are, therefore, labeled similarly. In addition, for clarity, only some of the components of the conventional STT-RAM memory block 1' are numbered. Thus, the conventional STT-RAM memory block 1' includes memory cells 10', local word liens 16', bit lines 18', and source lines 20' as well as global word lines 22, word line strap 24, reference generator 26, pre charge circuits 28, 29, and 30, read reference selector 32, bit line selectors 34, sense amplifiers precharge circuit 36, read sense amplifiers 38, and write control driver 40.

In the conventional STT-RAM memory block 1', j bit-lines 18' and m local word lines 16' are shown. There are thus j×m memory cells 10', each of which includes a magnetic element 12' and a selection device 14' that is typically a conventional NMOS transistor. The size of the conventional STT-RAM memory block 1' may vary as j and m vary depending on the memory architecture. The selection transistor 14' and magnetic element 12' are connected to the bit line 18', source line 20', and LWL 16' in an analogous manner to that depicted in FIG. 1. Referring back to FIG. 2, the gate 15' of each selection transistor 14' is connected to a LWL 16', while the source of the selection transistor 14' is tied to the source line 20', which minimizes the area (cost) of the conventional STT-RAM block 1'.

In addition to the local word lines 16', global word lines 22 are also utilized. The local word lines 16' and global word lines 22 are connected by the vias or contacts 42 in the word line strap 24. The global word lines 22 are typically metal lines with low resistance, while the local word lines are typically polysilicon with a relatively high resistance. In addition to the vias/contacts 42, power supply lines (not shown) and the well contacts (not shown) are typically in the word line strap 24 to supply the power, $V_{dd}$, and ground to the cells 10' in each block 1'. The use of global word lines 22 in conjunction with the local word lines 16' is typically used to speed up the local word line rise/fall time by reducing the maximum high resistance delay of the local word lines 16'.

The logic including, for example, reference generator 26, pre charge circuits 28, 29, and 30, read reference selector 32, bit line selectors 34, sense amplifiers precharge circuit 36, read sense amplifiers 38, and write control driver 40 are used to control the STT-RAM memory block 1'.

During the write operations, the appropriate local word line 16' is driven high and the selected one of the j bit lines 18' is selected by the bit line selector 34. The data for the write operation is sent to the write control driver 40, which drives the data in current either through the selected bit line 18' to the source line 20' via the selected memory cell 10' or through the source line 20' to the bit line 18', depending on the data. For the write operation, the R_WL line 44 is driven low to disable the reference line 46.

At the beginning of read operations, the pre-charge circuits 28, 29, and 30 pre-charge the bit lines 18' to a pre-charge voltage which may be from $V_{dd}$ to the Ground. Selected local word line(s) 16' is/are driven high. In addition, selected bit line(s) 18' is/are selected by the bit line selector controlled by the signals from the column address decoder (not specifically shown). The current flows through the selected memory cell 10' from the bit line 18' to the source line 20', which is connected to the ground. The value of the current depends on the data stored in the memory cell 10'. In addition, the reference line 46 is selected by the R_WL line 44 and the read reference selector 32, which is driven by an Rsel signal. Thus, reference current flows through the reference generator.

In order to read the data, conventional read sense amplifiers 38 are used. The conventional read sense amplifier reads out the data according to the difference between the selected bit line current and the reference line current.

Although the STT-MRAM 1/1' functions, one of ordinary skill in the art will readily recognize that the STT-MRAM 1/1' is desired to be improved.

BRIEF SUMMARY OF THE INVENTION

A method and system for providing a magnetic memory are described. The method and system include a plurality of magnetic storage cells, a plurality of bit lines, at least one reference line, and at least one sense amplifier. Each of the plurality of magnetic storage cells includes at least one magnetic element and at least one selection device. The at least one magnetic element is programmable using at least one write current driven through the magnetic element. The plurality of bit lines corresponds to the plurality of magnetic storage cells. The plurality of source lines corresponds to the plurality of magnetic storage cells. The at least one sense amplifier is coupled with the plurality of bit lines and at least one reference line. The sense amplifier also includes logic and a plurality of stages. The plurality of stages includes a first stage and a second stage. The first stage is for converting at least one current signal to at least one differential voltage signal. The second stage is for amplifying the at least one differential voltage signal. The logic is for selectively disabling at least one of the first stage and the second stage in the absence of a read operation and enabling the first stage and the second stage during the read operation.

According to the method and system disclosed herein, the present invention provides a magnetic memory employing spin transfer in writing to memory sells in conjunction with a sense amplifier used in reading the magnetic memory.

DETAILED DESCRIPTION OF THE INVENTION

Figure 1:
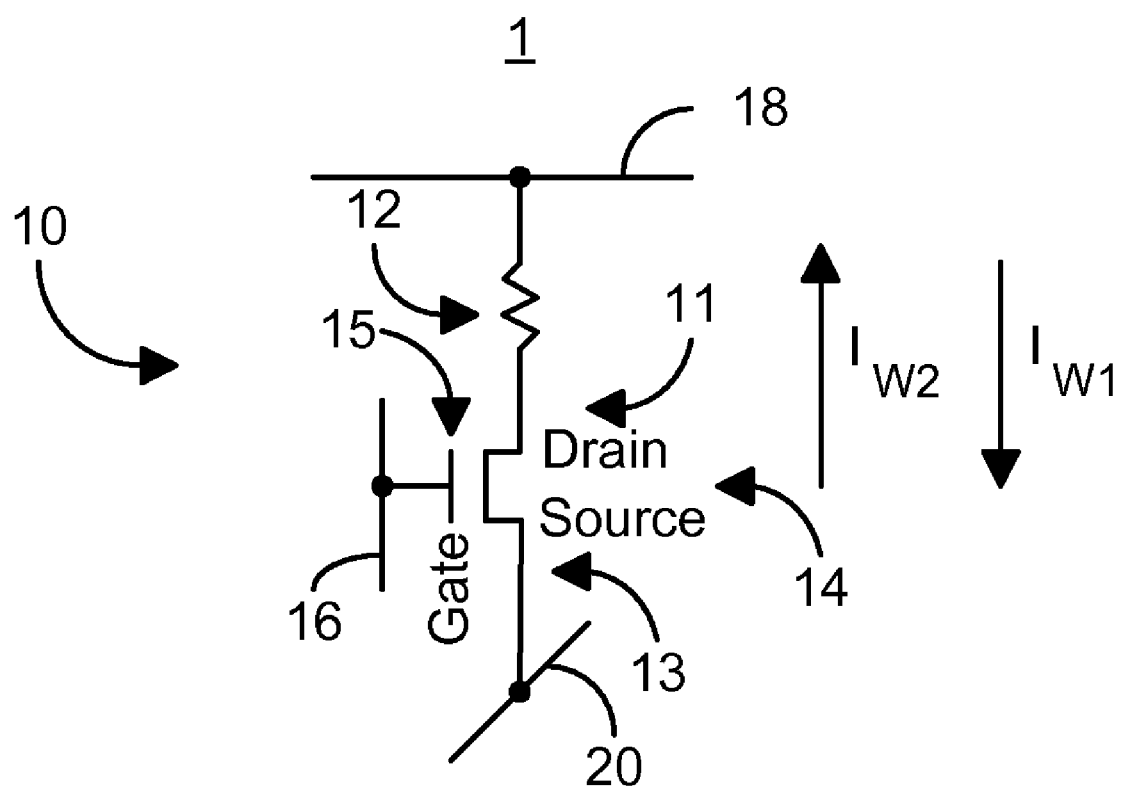
FIG. 1 is a diagram of a portion of a conventional magnetic memory employing the spin transfer effect.

The present invention relates to magnetic memories. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention is mainly described in terms of particular systems provided in particular implementations. However, one of ordinary skill in the art will readily recognize that this method and system will operate effectively in other implementations. For example, the systems, devices, and networks usable with the present invention can take a number of different forms. The present invention will also be described in the context of particular methods having certain steps. However, the method and system operate effectively for other methods having different and/or additional steps not inconsistent with the present invention. For example, the specific connections between the sense amplifier(s) and magnetic memory cells may be changed. The magnetic memory is also described in the context of a magnetic random access memory (MRAM), but may take other forms. The present invention is also described in the context of writing using spin transfer. One of ordinary skill in the art will recognize that in some embodiments, spin transfer may be used in addition to or in lieu of other writing mechanisms. The present invention will also be described in the context of particular methods having certain steps. However, the method and system operate effectively for other methods having different and/or additional steps not inconsistent with the present invention. One of ordinary skill in the art will also recognize that for clarity, the drawings are not to scale.

A method and system for providing a magnetic memory are described. The method and system include a plurality of magnetic storage cells, a plurality of bit lines, a plurality of source lines, and at least one sense amplifier. Each of the plurality of magnetic storage cells includes at least one magnetic element and at least one selection device. The at least one magnetic element is programmable using at least one write current driven through the magnetic element. The plurality of bit lines corresponds to the plurality of magnetic storage cells. The plurality of source lines corresponds to the plurality of magnetic storage cells. The at least one sense amplifier is coupled with the plurality of bit lines and at least one reference line. The at least one sense amplifier includes logic and a plurality of stages. The plurality of stages includes a first stage and a second stage. The first stage is for converting at least one current signal to at least one differential voltage signal. The second stage is for amplifying the differential voltage signal. The logic is for selectively disabling at least one of the first stage and the second stage in the absence of a read operation and enabling the first stage and the second stage during the read operation.

Figure 3:
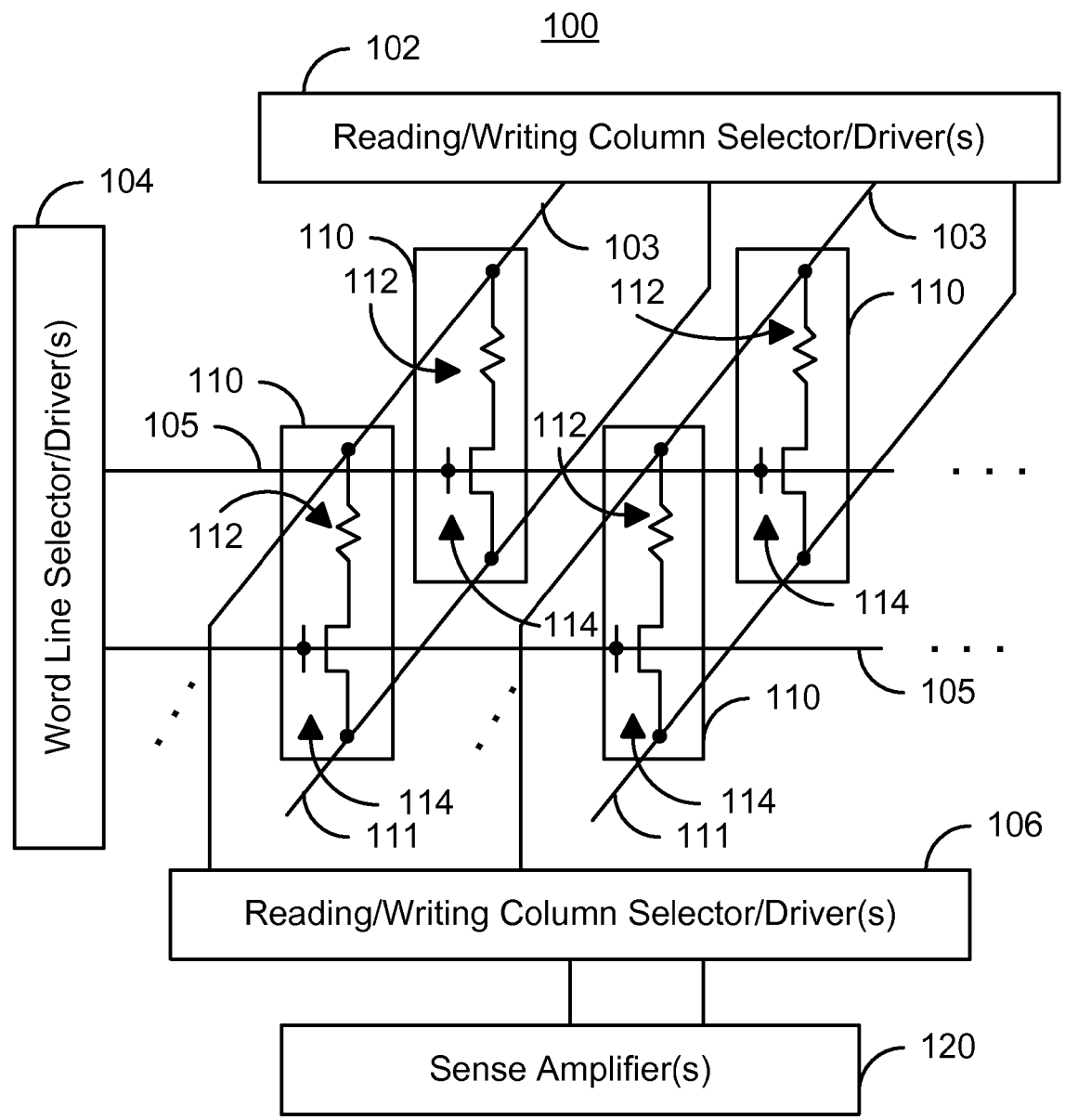
FIG. 3 is a diagram of an exemplary embodiment of a magnetic memory employing the spin transfer effect, including a sense amplifier.

FIG. 3 is a diagram of an exemplary embodiment of a magnetic memory 100 employing the spin transfer effect. The magnetic memory 100 is preferably a STT-RAM 100 and includes reading/writing column selector/drivers 102 and 106, word line selector/driver 104, and at least one sense amplifier 120. The STT-RAM 100 also includes memory cells 110 including a magnetic element 112 and a selection device 114. The selection device is preferably some type of transistor. The magnetic element 112 utilizes the spin transfer effect in switching and preferably exhibits a high magnetoresistance and for example may include single or dual spin valves, single or dual magnetic tunneling junctions, and/or ballistic magnetoresistive elements. The reading/writing column selector/drivers 102 and 106 may be used to selectively drive current through the bit lines 103 and source lines 111, and thus the cells 110. The word line selector/driver 104 selectively enables row(s) of the STT-RAM 100 by enabling the non-planar transistor 114 coupled with the selected word line 105.

Figure 4:
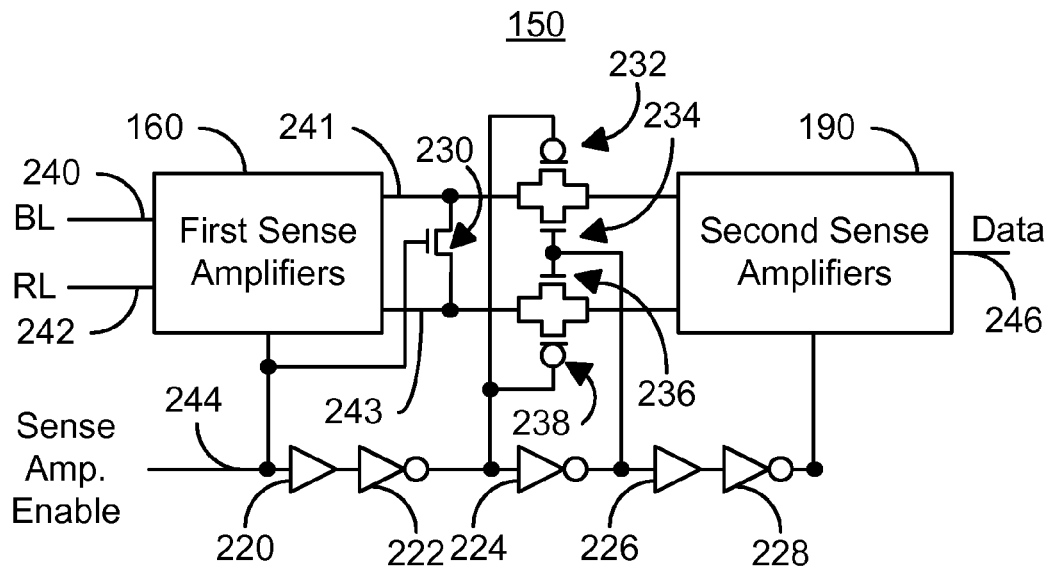
FIG. 4 is a diagram of an exemplary embodiment of a sense amplifier usable in a memory employing the spin transfer effect.

FIG. 4 is a diagram of an exemplary embodiment of a sense amplifier 150 usable in a memory employing the spin transfer effect, such as the memory 100. Alternatively, the sense amplifier 150 may be employed in a memory such as the conventional memory 1 and/or 1'. Thus, the sense amplifier 150 may be used as one or more of the sense amplifier(S) 120 and/or read sense amplifier(s) 38. The sense amplifier 150 is a multi-stage sense amplifier. Thus, the sense amplifier 150 includes at least a first stage 160, a second stage 190, and logic 152. Also shown are bit line 240, reference line 242, sense amplifier enable line 244, and data line 246. The reference line 242 may correspond to the reference line 46 of FIG. 2 or another reference line. The bit line 244 corresponds to the bit line 18' or 103 and thus receives the signal from the magnetic cell being read (not shown in FIG. 4). The first stage 160 is for converting a current signal to a differential voltage signal. In particular, current difference between the reference line 242 and bit line 240 is converted into a differential voltage and output on first stage outputs 241 and 243. The second stage 190 is for amplifying the differential voltage signal and providing an output signal over the data line 246. Note that the output signal may be a single ended "rail-too-rail" signal output on data line 246. The logic 152 may be used in selectively disabling at least one of the first stage 160 and the second stage 190 in the absence of a read operation and enabling the first stage 160 and the second stage 190 during the read operation. The logic 152 includes gates 220, 222, 224, 226, and 228 as well as transistors 230, 232, 234, 236, and 238. The transistors 232 and 238 may be PMOS transistors, while the remaining transistors 230, 234, and 236 may be NMOS transistors. The transistors 232, 234, 236, and 238 may be considered to form transmission gates. In addition, the gates 220, 222, 224, 226, and 228 may be used to introduce a delay. Note that the gates 220, 222, 224, 226, and 228 include inverting and non-inverting gates.

In operation, the appropriate bit line 103 is enabled. In one embodiment, this is accomplished using a pulse that enables the appropriate line via the selector driver(s) 102 and/or 106. In one embodiment, the components are selective enabled using pulses. As a result, the appropriate components are enabled only as they are used. However, in another embodiment, pulses may be used for some (or none) of the components. The sense amplifier enable line 244 may be driven high. Consequently, both the first stage 160 and the second stage 190 are disabled. As a result, the voltage output on lines 241 and 243 are equalized to half of the power supply voltage, or $V_{dd}/2$. The two transmission gates formed by transistors 232 and 234 and transistors 236 and 238 are conductive. Consequently, the output differential voltage signal on the lines 241 and 243 is input to the second stage 190. The output data is tri-state.

When the sense amplifier enable line 244 is driven low, the transistor 230 is cut off. The transistor 230, which may function as an equalization NMOS transistor, is thus cut off while the inputs of the second stage 190 are still connected to the outputs of the first stage 160. In addition, the first stage 160 turns on when the line 244 is driven low. After the differential voltage signal is developed on the output lines 241 and 243 of the first stage 160, the sense amplifier enable line is driven high (delayed). The transmission gates formed from transistors 232, 234, 236, and 238 turns off and the second stage 190 turns on. The second stage voltage 190 amplifies the input differential voltage signal from the lines 241 and 243. Thus, the second stage 190 generates a voltage that may either be ground or $V_{dd}$ and outputs the generated voltage on the data line 246.

If the voltage output by the first stage 160 on the output line 241 is greater than that on the other output line 243, the voltage output by the second stage 190 on the line 246 is $V_{dd}$. Otherwise, the voltage output by the second stage 190 on the line 246 is ground. Cutting off the transmission gates formed from transistors 232, 234, 236, and 238 when the second stage 190 turns on aids in reducing the load on the second stage 190. Consequently, the speed of the second stage 190, and thus the sense amplifier 150 may be improved. In a preferred embodiment, the signals on lines 241 and 243 are sufficiently well developed before the transmission gates formed by transistors 232, 234, 236, and 238 turn off so that the second stage 190 may generate the correct value for the data being read.

Thus, using the sense amplifier 150, a memory employing spin transfer switching may be read. In particular, a single ended amplified signal may be provided from the memory. Moreover, this may be achieved while improving the speed of the read operation using the sense amplifier 150.

Figure 5:
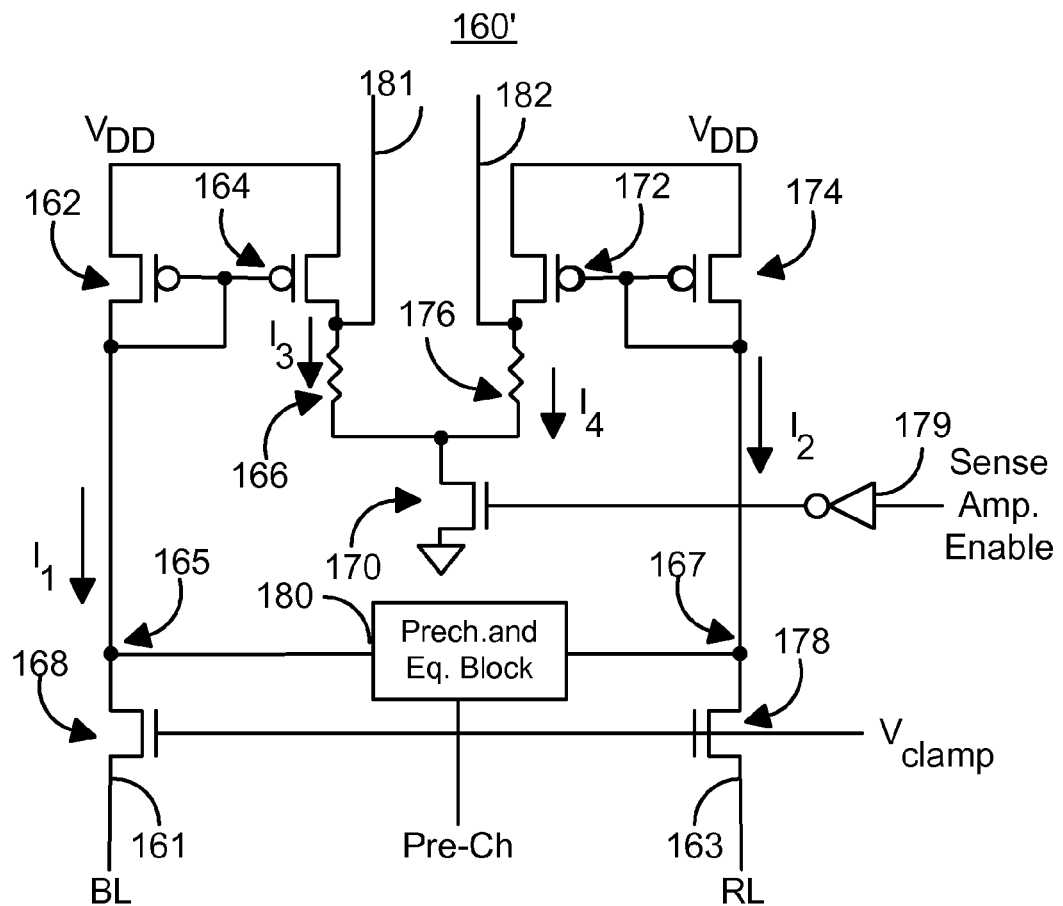
FIG. 5 is a diagram of an exemplary embodiment of the first stage of a sense amplifier usable in a memory employing the spin transfer effect.

FIG. 5 is a diagram of an exemplary embodiment of the first stage 160' of a sense amplifier such as the sense amplifier 150. Thus, the first stage 160' may be used in the sense amplifier 150 depicted in FIG. 4. Referring back to FIG. 5, the stage 160' includes transistors 162, 164, 168, 170, 172, 174, and 178, inputs 161 and 163, resistors 166 and 176, gate 179, precharge and equalization block 180, and outputs 181 and 182. The transistors 162, 164, 172, and 174 may be PMOS transistors, while the remaining transistors 168, 170, and 178 may be NMOS transistors. The transistors 162, 164, 172, and 174 may all have substantially the same gate length and width. Consequently, the first stage 160' is described in this context. Although differences between the transistors 162, 164, 172, and 174 may be possible, in one embodiment all these transistors have substantially the same channel length. In such an embodiment, the widths of 162 and 174 are substantially the same and the widths of 164 and 172 are substantially the same. In addition, the inputs 161 and 163 and outputs 181 and 182 correspond to the bit line 240, reference line 142, and lines 241 and 243, respectively, depicted in FIG. 4.

Referring back to FIG. 5, the first stage 160' thus includes two pairs of current mirrored transistors, which are preferably substantially the same. The transistors 162 and 164 form one pair, while transistors 172 and 174 form another pair. The transistors 164 and 174 are connected to resistors 166 and 176 which may be identical. The resistors 166 and 176 are connected to transistor 170, which is coupled to ground and controlled by the sense amplifier enable signal that is input to the gate 179. The transistors 168 and 178 are controlled by signal $V_{clamp}$ and coupled to the inputs 161 and 163. The $V_{clamp}$ signal provided to the transistors 168 and 178 may have a bias voltage used to control the maximum current allowed through the transistors 168 and 178. The transistors 168 and 178 have the same size and both work in the saturated region. Consequently, the voltage $V_{clamp}$ is approximately half of the supply voltage $V_{dd}$. The value of $V_{clamp}$ may also depend upon the size of the current allowed to flow through the transistors 168 and 178.

During a read operation, the signal Pre-ch controlling the precharge and equalization block 180 is disabled. A current, $I_1$, flows from the transistor 168, while a current $I_2$ flows from the transistor 178. The current difference, $I_1-I_2$, can be positive or negative, depending on the value stored in the selected magnetic memory cell 10'/110. When the sense amplifier enable signal goes low, inverting gate 179 outputs a high signal, turning on the transistor 170. In such a case, the current through the resistor 166, $I_3$, is equal to $I_1$ if transistors 162 and 164 are substantially identical. In addition, the current through the resistors 176, $I_4$, is equal to $I_2$ if transistors 172 and 174 are substantially the same. The current $I_3$ generates a voltage across the resistor 166. Similarly, the current $I_4$ results in voltage across the resistor 176. Thus, there is a differential voltage signal on outputs 181 and 182. This differential voltage signal depends upon $I_1-I_2$ and can thus be positive or native depending on $I_1-I_2$. More specifically, the differential voltage signal may be proportional to $I_1-I_2$. Stated differently, $V=R(I_1-I_2)$ where R is the resistance of the resistors 166 and 176.

After a read operation, the selected cell 10'/110 is deselected because the corresponding word line 16' is driven low. In addition, the sense amplifier enable signal goes low. As a result, the output of the inverting gate 179 goes high. Consequently, the precharge and equalization block 180 is enabled. The pre-charge and equalization block 180 equalizes the nodes 165 and 167, charging both nodes to a pre-charge voltage which is between ground and power supply $V_{dd}$. As discussed above, the transistors 162, 164, 172, and 174 have the same gate lengths and widths. However, in another embodiment, the ratio of the width of the transistor 162 to the width of the transistor 164 might be varied. For example, the widths could obey the relationship $2W_{162}=W_{164}$, while the lengths of the transistors 162 and 164 remain the same. As a result, the current is amplified such that $I_3=2I_1$. Similarly, the width ratio of the transistors 172 and 174 might also vary. However, the ratio for transistors 162 and 164 should be the same as the ratio for the transistors 172 and 174. In this case, $\Delta V=2R(I_1-I_2)$ where R is the resistance of the resistors 166 and 176.

Figure 6:
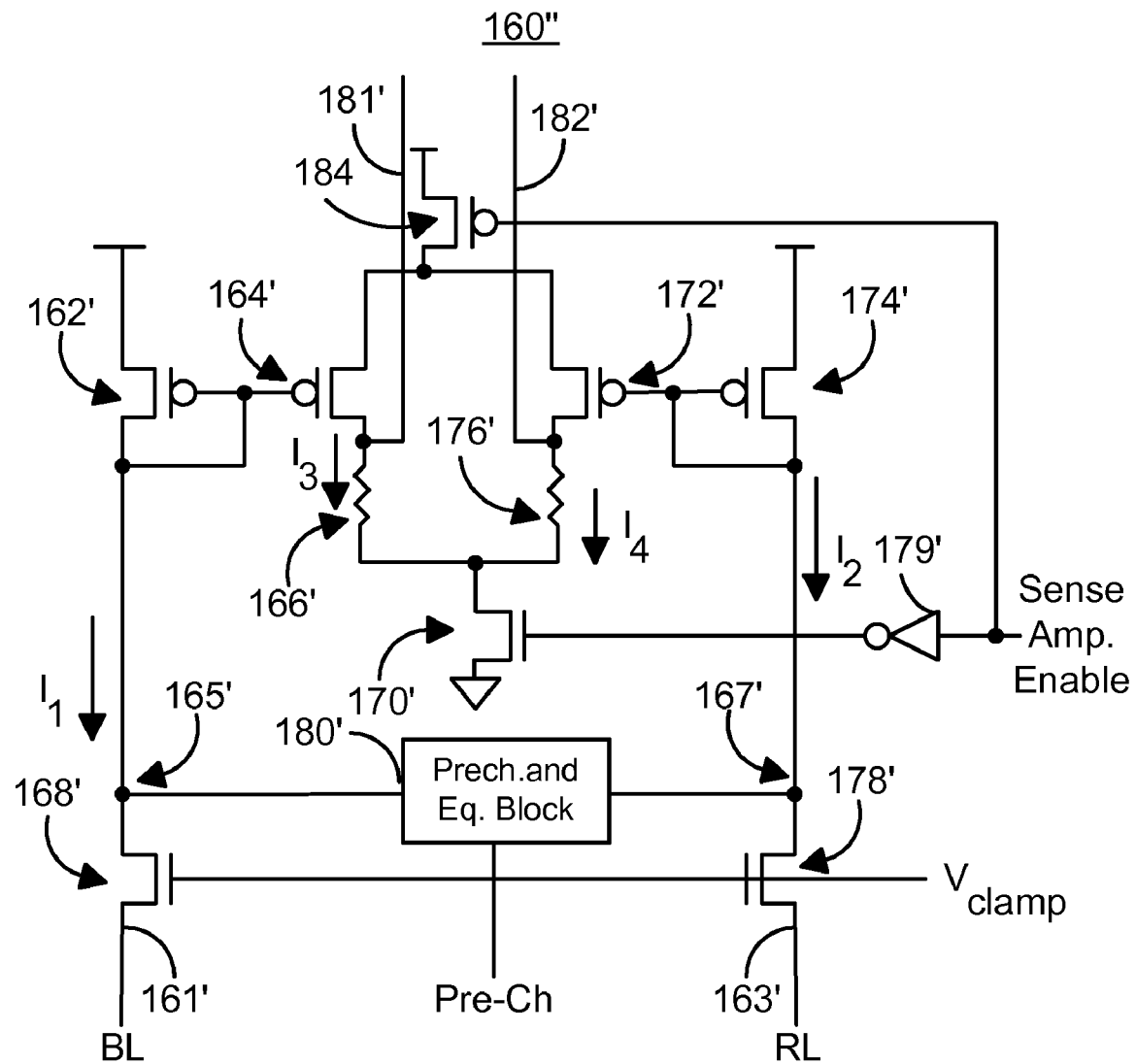
FIG. 6 is a diagram of another exemplary embodiment of the first stage of a sense amplifier usable in a memory employing the spin transfer effect.

FIG. 6 is a diagram of another exemplary embodiment of the first stage 160" of a sense amplifier usable in a memory employing the spin transfer effect. The first stage 160" is analogous to the first stage 160' depicted in FIG. 5. Consequently, components of the first stage 160" are labeled similarly. Thus, the first stage 160" may be used in the sense amplifier 150 depicted in FIG. 4. Referring back to FIG. 5, the stage 160" includes transistors 162', 164', 168', 170', 172', 174', and 178', inputs 161' and 163', resistors 166' and 176', gate 179', precharge and equalization block 180', and outputs 181' and 182'. Thus, the first stage 160" thus includes two pairs of current mirrored transistors. In addition, the first stage 160" includes an additional transistor 184, which may be a PMOS transistor. The additional transistor is also controlled by the sense amplifier enable signal.

The first stage 160" functions in an analogous manner to the first stage 160'. In addition, when the sense amplifier enable signal is high, the output of the inverting gate 179' is low. Consequently, both the transistor 170' and the transistor 184 are turned off. The outputs 181' and 182' are, therefore, floating. Consequently, the transistor 230 can more easily equalize the outputs 181' and 182'. In addition to the benefits provided by the first stage 160', the first stage 160" may more readily equalize the outputs 181' and 182' to the middle of $V_{dd}$ and ground.

Figure 7:
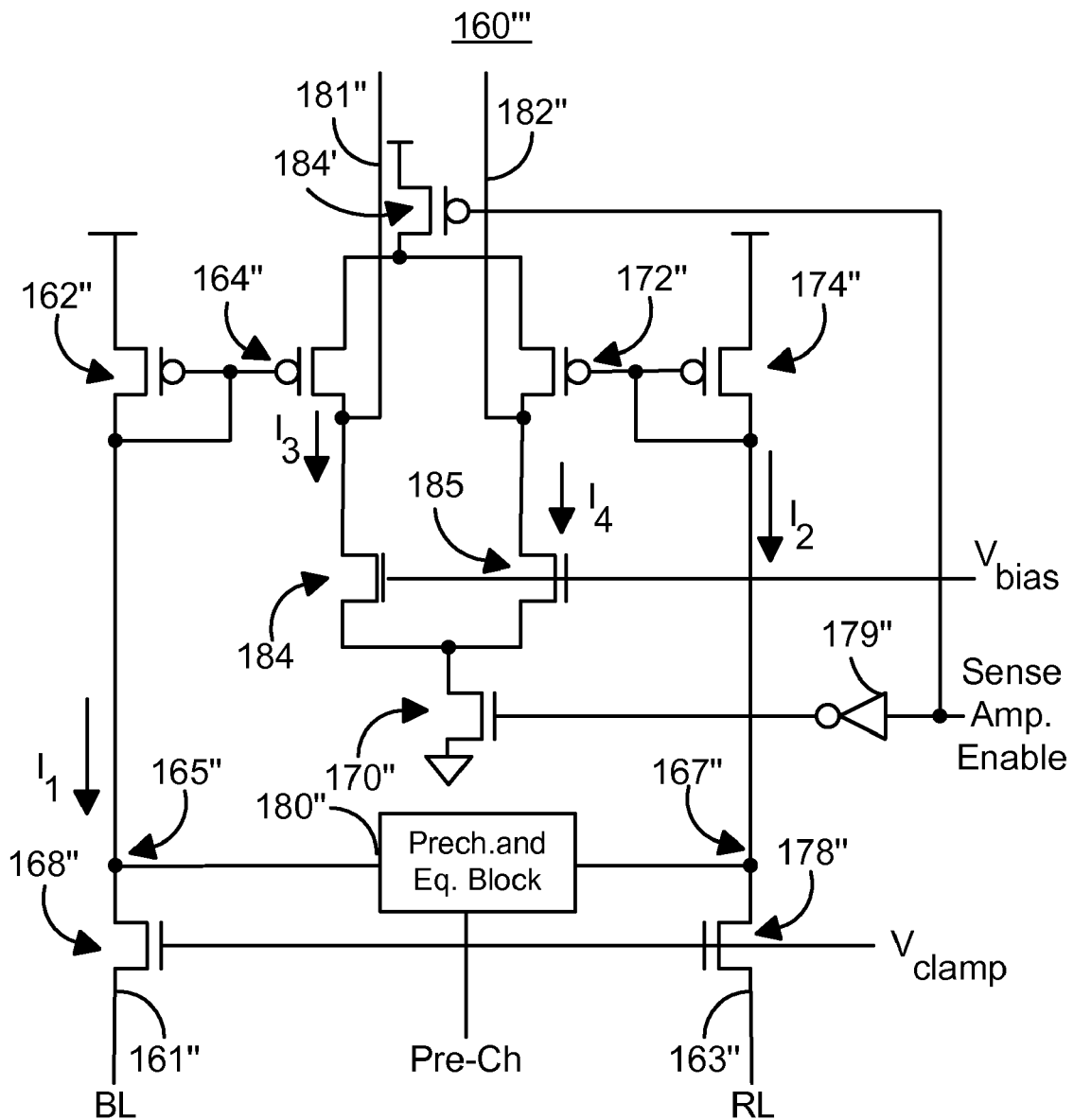
FIG. 7 is a diagram of another exemplary embodiment of the first stage of a sense amplifier usable in a memory employing the spin transfer effect.

FIG. 7 is a diagram of another exemplary embodiment of the first stage 160''' of a sense amplifier usable in a memory employing the spin transfer effect. The first stage 160''' is analogous to the first stage 160' depicted in FIG. 5 as well as the first stage 160" depicted in FIG. 6. Consequently, components of the first stage 160''' are labeled similarly. Thus, the first stage 160''' may be used in the sense amplifier 150 depicted in FIG. 4. Referring back to FIG. 7, the stage 160''' includes transistors 162", 164", 168", 170", 172", 174", and 178", inputs 161" and 163", gate 179", precharge and equalization block 180", outputs 181" and 182", as well as the additional transistor 184'. Thus, the first stage 160''' thus includes two pairs of current mirrored transistors as well as the additional transistor 184' controlled by the sense amplifier enable signal.

The first stage 160''' functions in an analogous manner to the first stage 160". Thus, in addition to the benefits provided by the first stage 160', the first stage 160''' may more readily equalize the outputs 181" and 182". However, the resistors 166/166' and 176/176' have been replaced by transistors 184 and 185. The transistors 184 and 185 are substantially identical. The transistors 184 and 185 are controlled by signal $V_{bias}$, which is set such that the transistors 184 and 185 operate in the saturation region when enabled. By changing the $V_{bias}$, the resistances of the transistors 184 and 185 may be changed. The transistors 184 and 185 operate similarly to the resistors 166/166' and 176/176', developing a voltage difference between the outputs 181''' and 182'''. However, the transistors 184 and 185 are smaller. Consequently, in addition to the benefits of the first stages 160' and 160", the first stage 160''' may consume less area.

Figure 8:
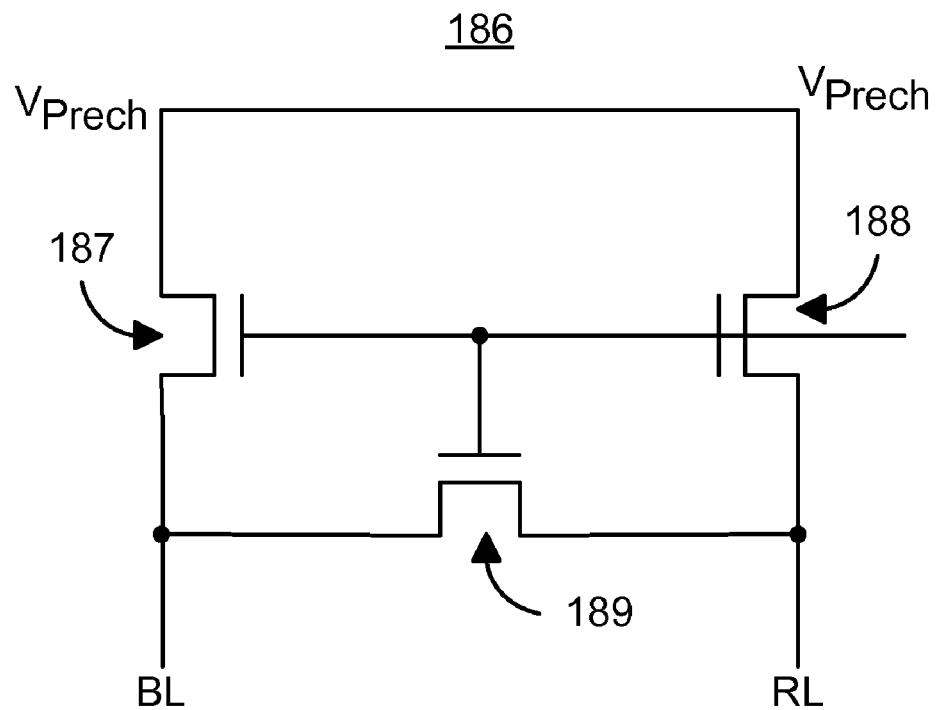
FIG. 8 is a diagram of an exemplary embodiment of pre-charge and equalization circuitry for the first stage of a sense amplifier usable in a memory employing the spin transfer effect.

FIG. 8 is a diagram of an exemplary embodiment of precharge and equalization circuitry 186 for the first stage of a sense amplifier usable in a memory employing the spin transfer effect. The precharge and equalization circuitry 186 may be used for the precharge and equalization block 180, 180', and/or 180". The precharge and equalization circuitry 186 includes transistors 187, 188, and 189, which may be NMOS transistors. The NMOS transistors 187, 188, and 189 are preferred for use when the signals from the memory cell and reference line are less than $V_{dd}-V_t$, where $V_t$ is the threshold voltage of the transistor 187, 188, or 189 used to turn the transistor 187, 188, or 189 when the signal pre-charge enable "Pre-Ch" is enabled. Thus, for memories in which the bit line 240/161/161'/161" and reference lines 242/163/163'/163" are charged to less than the supply voltage minus $V_t$, the precharge and equalization circuitry 186 may be preferred.

Figure 9:
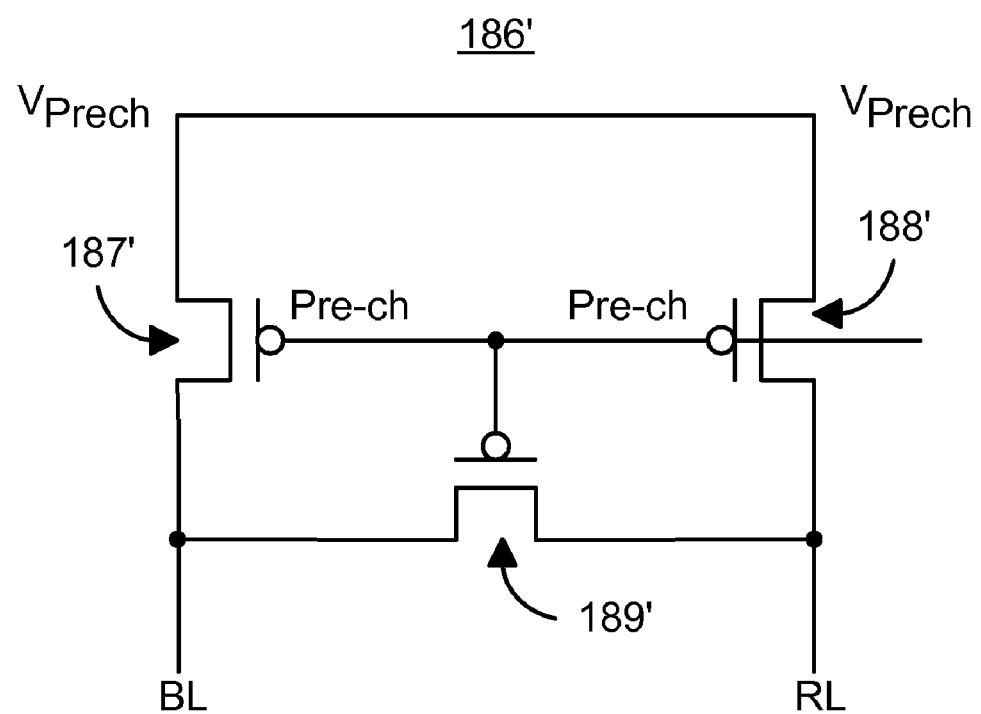
FIG. 9 is a diagram of an exemplary embodiment of pre-charge and equalization circuitry for the first stage of a sense amplifier usable in a memory employing the spin transfer effect.

Similarly, FIG. 9 is a diagram of another exemplary embodiment of precharge and equalization circuitry 185' for the first stage of a sense amplifier usable in a memory employing the spin transfer effect. The precharge and equalization circuitry 186' is analogous to the precharge and equalization circuitry 186. Consequently, analogous components are labeled similarly. The precharge and equalization circuitry 186' includes transistors 187', 188', and 189', which may be PMOS transistors. The PMOS transistors 187', 188', and 189' are preferred for use when the signals from the memory cell and reference line are greater than $V_{dd}-V_t$, where $V_t$ is the threshold voltage of the transistor 187', 188', or 189' used to turn the transistor 187', 188', or 189 when the signal pre-charge enable "Pre-Ch" is disabled. Thus, for memories in which the bit line 240/161/161'/161" and reference lines 242/

163/163'/163" are charged to greater than the supply voltage minus $V_t$, the precharge and equalization circuitry 186' may be preferred.

Figure 10:
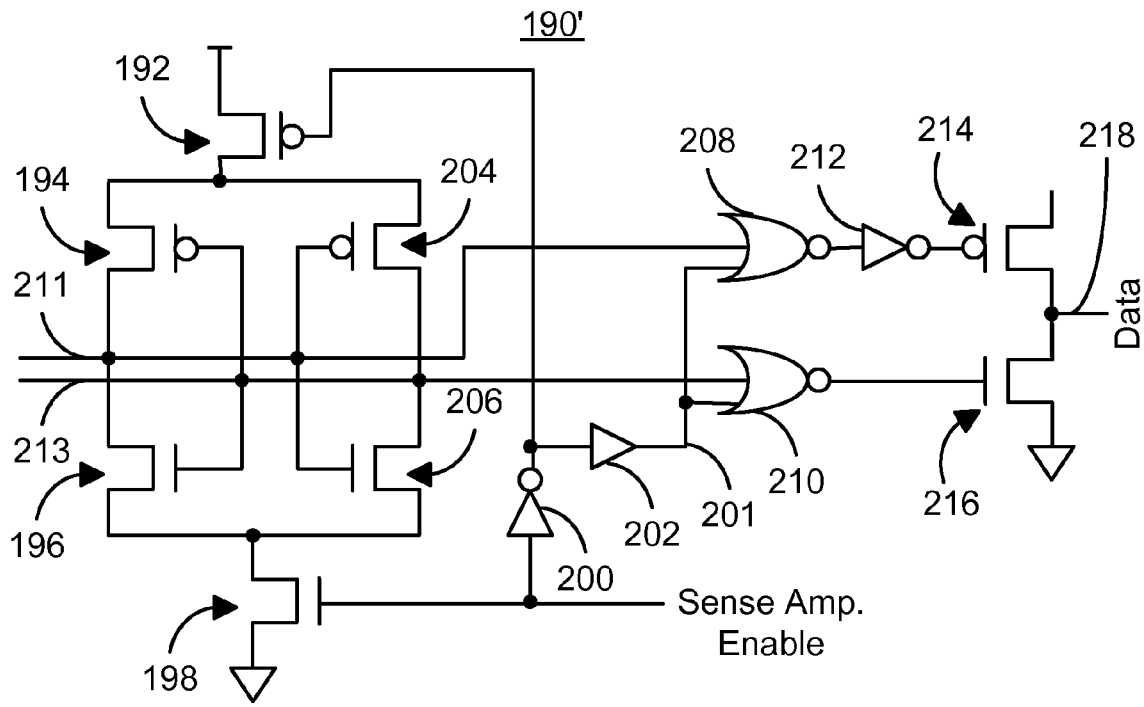
FIG. 10 is a diagram of an exemplary embodiment of a stage of a sense amplifier usable in a memory employing the spin transfer effect.

FIG. 10 is a diagram of an exemplary embodiment of a stage 190' of a sense amplifier usable in a memory employing the spin transfer effect. Thus, the second stage 190' may be used in the sense amplifier 150 depicted in FIG. 4. Referring back to FIG. 10, the second stage includes transistors 192, 194, 196, 198, 204, 206, 214, and 216 as well as gates 200, 208, 210, and 212. The transistors 192, 194, 204, and 214 may be PMOS transistors, while the transistors 196, 206, 198 and 216 may be NMOS transistors. The transistors 194, 204, 196, and 206 may be organized as a positive feed-back differential sense amplifier. In operation, when the sense amplifier enable signal is low, the transistors 192 and 198 are cut off. The positive feedback differential sense amplifier formed by transistors 194, 204, 196, and 206 is disabled. Consequently, the nodes 211 and 213 are floating. The output node 211 and 213 correspond to the lines 241 and 243 of FIG. 4. Referring back to FIG. 10, the nodes 211 and 213 are connected to the outputs of the first stage sense amplifier (not shown in FIG. 10). Because the node 201 is high the transistors 214 and 216 are cut off. Consequently, the output data to the data bus 218 floats (or keeps the previous value(s)). During read operation, the first stage 160/160'/160"/160''' develops a voltage difference on nodes 211 and 213.

When the sense amplifier enable signal for the second stage 190 is high, the transistor 198 turns on first. The transistor 192 then turns on. At the first, the voltages on the nodes 211 and 213 fall simultaneously toward ground and the transistor 198 turns on. Because the initial voltage values on the nodes 211 and 213 are different, the dynamic drain-source resistances of the transistors 196 and 206 are different. The two node voltages are, therefore, falling at different speed. Thus the voltage difference between lines 211 and 213 increases. In turn, the dynamic drain-source resistance difference increases further because of the positive feedback of the transistors 196 and 206. The turning on of the positive feedback-coupled transistors 194 and 204 further increase the speed at which the voltages on the lines 211 and 213 split. The two transmission gates 208 and 210 are cut off to decouple the inputs 211 and 213 from the first stage (not shown in FIG. 10). This cut-off aids in reducing the load on the second stage 190' during amplification of the signal. In addition, the time for amplification is also decreased. Once the voltage difference between the lines 211 and 213 is sufficiently large, the node 201 goes low. One of the transistors 214 or 216 turns on. The transistor 214 or 216 that turns on depends on the voltage from the inputs 211 and 213 from the first sense amplifier (not shown). Thus, the data is driven onto the output line 218. When the sense amplifier enable signal goes low, the transistors 198 and 192 turn off. The lines 211 and 213 are pre-charged. In addition, the node 201 is high, cutting off the transistors 214 and 216. Thus, a single ended, amplified output signal may be provided from the memory 1'/100. This may be provided more quickly and while consuming less area. Note that after the voltage difference between the lines 211 and 213 is large enough, there is no DC path on 192, 194, 196, 198, 204 and 206 (data is latched). Therefore there is substantially no DC power consumption after the data are latched.

Figure 2:
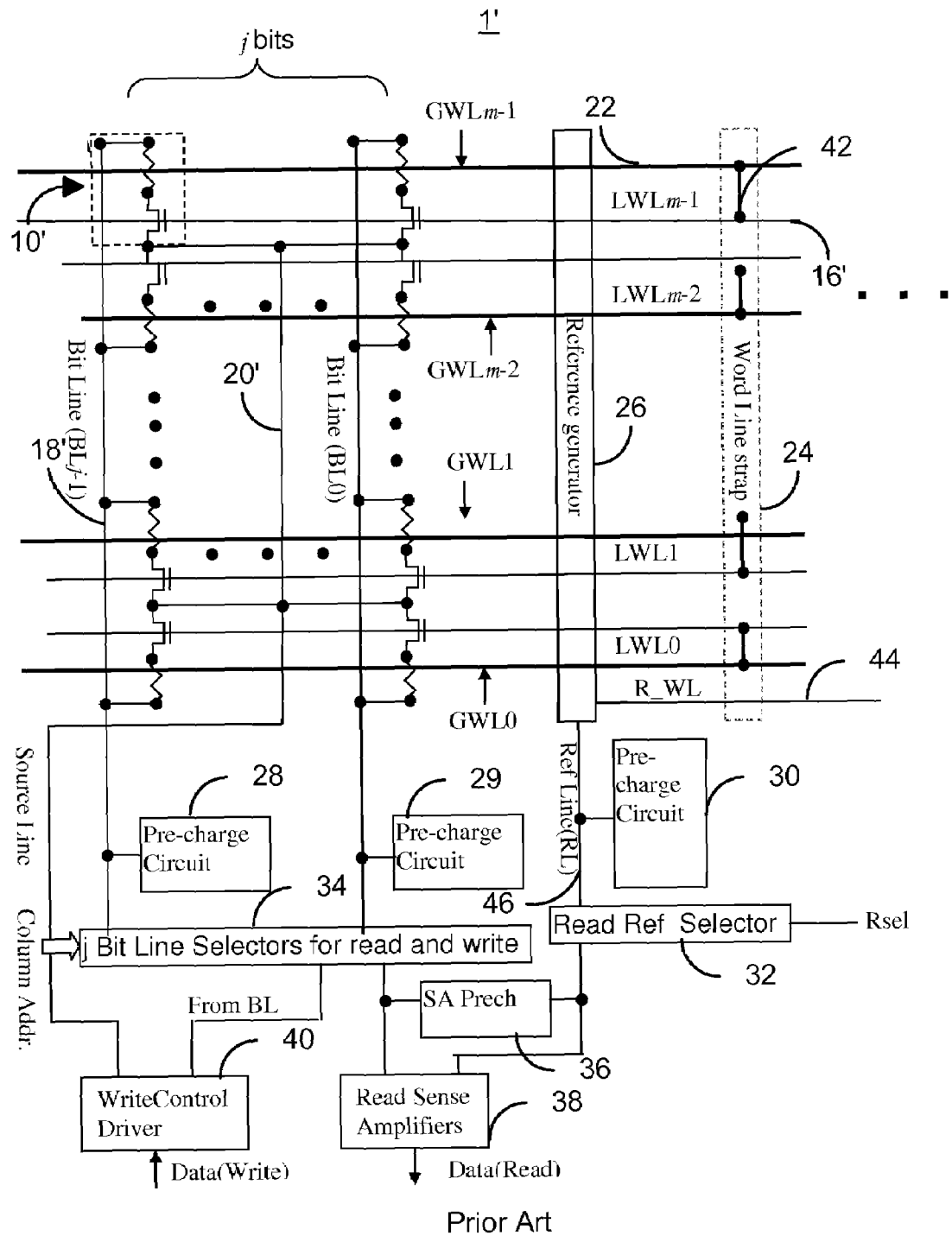
FIG. 2 is a diagram of a portion of a magnetic memory array employing the spin transfer effect.
Figure 11:
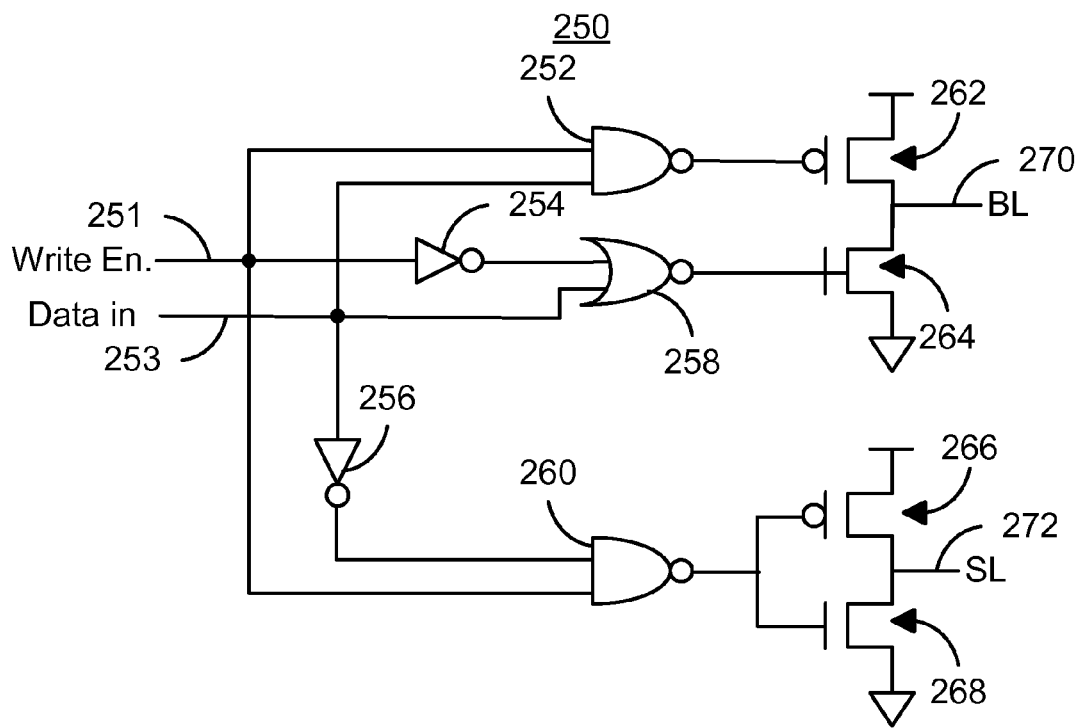
FIG. 11 is a diagram of an exemplary embodiment of a write driver usable in a memory employing the spin transfer effect.

FIG. 11 is a diagram of an exemplary embodiment of a write driver 250, shown in FIG. 2, usable in a memory employing the spin transfer effect. Thus, the write driver 250 may be used in as one of the write drivers in the reading/writing column selector/drivers 102 and/or 106 in the magnetic memory 100 and/or as the write control driver 40 in the magnetic memory 1'. The output of the write driver 250 is provided on the bit line 270 and/or source line 272, which may correspond to the bit line 240, 103, and/or 18' and the source lien 242, 111, and/or 20', respectively. The write driver includes inverting gates 254 and 256, NAND gates 252 and 260, and NOR gate 258 as well as transistors 262, 264, 266, and 268. The transistors 262 and 266 may be PMOS transistors, while the transistors 264 and 268 may by NMOS transistors.

In operation, a write enable signal is driven high on the input line 251 during a write operation. The data, datain, is provided on the other input line 253. The data is driven to outputs 270 and 272. In one scheme, if the data is a logical "0", the output of the NAND gate 252 is $V_{dd}$ while the output of the NOR gate 258 is high, for example the supply voltage $V_{dd}$. Consequently, the transistor 262 is off while the transistor 264 is on. The output 270 thus drains to ground. In addition, the output of the NAND gate 260 is low. Consequently, the transistor 268 is off while the transistor 266 is on. Consequently, the output 272 is high, preferably $V_{dd}$. The write current is thus driven from the source line 272 to the bit line 270 through the memory cell (not shown in FIG. 11). In contrast, if the data is a logical "1", then the outputs of the NAND gate 252 and the NOR gate 258 are both low. Consequently, the output 270 is coupled to $V_{dd}$. Similarly, the output of the NAND gate 260 is high. Thus, the transistor 266 is off while the transistor 268 is on. The source line 272 is thus coupled to ground. The write current thus flows through the selected memory cell (not shown in FIG. 11) the opposite direction. Consequently, the desired data may be written to the desired memory cell.

Figure 12:
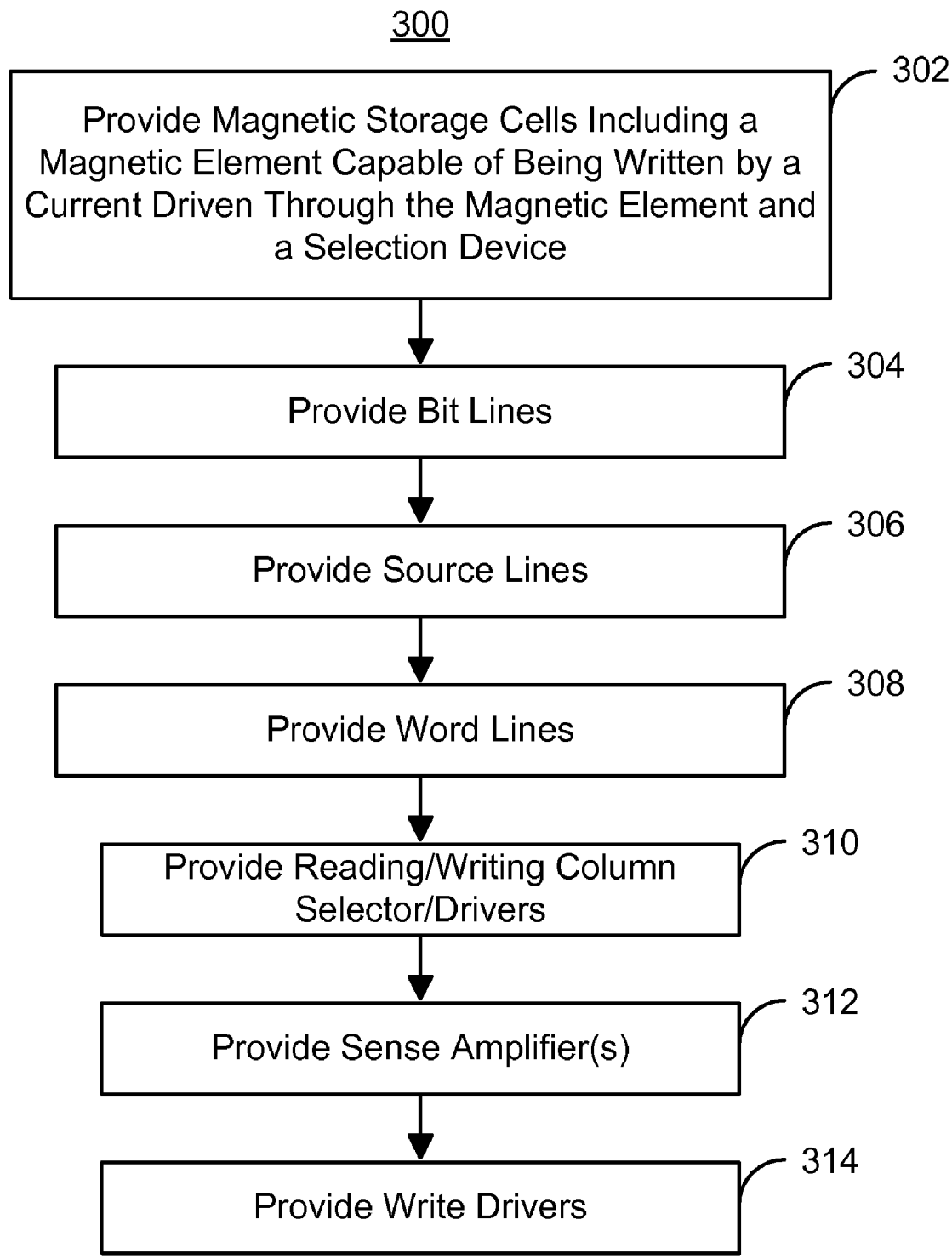
FIG. 12 is a diagram of an exemplary embodiment of a method for providing a magnetic memory employing the spin transfer effect, including an exemplary embodiment of a sense amplifier.

FIG. 12 is a diagram of an exemplary embodiment of a method 300 for providing a magnetic memory employing the spin transfer effect, including an exemplary embodiment of a sense amplifier. For clarity, the method 300 is described in context of the memory 100 in FIG. 3 and sense amplifier 150 in FIG. 4. However, in alternate embodiments, other configurations may be used. A plurality of magnetic storage cells 110 is provided, via step 302. Each of the magnetic storage cells 110 includes at least one magnetic element 112 and at least one selection device 114. The magnetic element(s) are programmable using write current(s) driven through the magnetic element 112. A plurality of bit lines 103 corresponding to the magnetic storage cells 110 are provided, via step 304. The source lines 111 corresponding to the magnetic storage cells 110 are also provided, via step 306. Thus, the storage cells in the memory 100 may be provided. The word lines 105 may be provided, via step 308. Step 308 might include providing local and global word lines. Reading/writing column selector/drivers 102 and/or 106 may be provided, via step 310. Step 310 may include providing the write driver 250 depicted in FIG. 11. Referring back to FIGS. 3 and 12, at least one sense amplifier 120 coupled with the bit lines 103 is provided, via step 312. Step 312 includes providing logic and a providing the stages of the sense amplifier 120. Thus, step 312 may include providing the sense amplifiers 120 and/or 150 including stages 160, 160', 160", 160''', 190, and 190'. Write driver(s) 106 and/or 250 may also be provided, via step 314. Fabrication of the memory may then be completed.

Using the method 300, the memory 100 or 1' using the sense amplifier 120 and/or 150 may be provided. Consequently, the benefits of the stages 160, 160', 160", 160''', 190, and/or 190' and/or write driver(s) 106 and/or 250 might be achieved.

A method and system for providing a magnetic memory utilizing the spin transfer effect and a preamplifier for reading the magnetic memory has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic memory comprising:
   a plurality of magnetic storage cells, each of the plurality of magnetic storage cells including at least one magnetic element and at least one selection device, the at least one magnetic element being programmable using at least one write current driven through the magnetic element;
   a plurality of bit lines corresponding to the plurality of magnetic storage cells;
   at least one reference line for providing at least one reference signal;
   at least one sense amplifier coupled with the plurality of bit lines and the at least one reference line, the at least one sense amplifier having logic and a plurality of stages, the plurality of stages including a first stage and a second stage, the first stage for converting at least one current signal to at least one differential voltage signal and the second stage for amplifying the at least one differential voltage signal, the logic for selectively disabling at least one of the first stage and the second stage in the absence of a read operation and enabling the first stage and the second stage during the read operation, the first stage including a first stage enable input, a first output and a second output, the second stage including a second stage enable input, first input coupled with the first output and a second input coupled with the second output;
   wherein the logic further includes a plurality of noninverting gates interleaved with a plurality of inverting gates coupled between the first stage enable input and the second stage enable input, a first transistor coupled between the first output and the second output and being enabled by the first stage enable input, and a plurality of transistor pairs coupled between the first and second outputs and the first and second inputs.

2. The magnetic memory of claim 1 wherein the plurality of transistor pairs further includes:
   a first transistor pair including a first transistor having a first type and a second transistor having a second type different from the first type, the first transistor pair being coupled between the first output and the first input; and
   a second transistor pair including a third transistor having the first type and a fourth transistor having the second type different from the first type, the second transistor pair being coupled between the second output and the second input.

3. The magnetic memory of claim 1 wherein the first stage further includes:
   a first pair of current mirrored transistors;
   a second pair of current mirrored transistors corresponding to the first pair of current mirrored transistors, the first pair of current mirrored transistors and the second pair of current mirrored transistors providing the at least one differential voltage signal.

4. The magnetic memory of claim 1 wherein the second stage further includes a plurality of transistors configured as a differential voltage sense amplifier.

5. The magnetic memory of claim 1 further comprising:
   a plurality of source lines corresponding to the plurality of magnetic storage cells at least one write driver coupled to the plurality of bit lines and the plurality of source lines, the write driver including a plurality of logic gates configured to selectively couple at least one of the plurality of bit lines to a first high voltage and at least one of the plurality of source lines to a first low voltage and to selectively the at least one of the plurality of bit lines to a second low voltage and the at least one of the plurality of source lines to a second high voltage.

6. The magnetic memory of claim 1 wherein the plurality of bit lines and the at least one reference line are configured to be selectively pre-charged to a pre-charge state before the sense amplifier is enabled.

7. The magnetic memory of claim 1 wherein the first stage includes a plurality of outputs, the magnetic memory further comprising:
   a transistor coupled between the plurality of outputs, the transistor for equalizing the plurality of outputs prior to a read operation.

8. A magnetic memory comprising:
   a plurality of magnetic storage cells, each of the plurality of magnetic storage cells including at least one magnetic element and at least one selection device, the at least one magnetic element being programmable using at least one write current driven through the magnetic element;
   a plurality of bit lines corresponding to the plurality of magnetic storage cells;
   at least one reference line for providing at least one reference signal;
   at least one sense amplifier coupled with the plurality of bit lines and the at least one reference line, the at least one sense amplifier having logic and a plurality of stages, the plurality of stages including a first stage and a second stage, the first stage for converting at least one current signal to at least one differential voltage signal and the second stage for amplifying the at least one differential voltage signal, the logic for selectively disabling at least one of the first stage and the second stage in the absence of a read operation and enabling the first stage and the second stage during the read operation, wherein the first stage further includes:
   a first pair of current mirrored transistors;
   a second pair of current mirrored transistors corresponding to the first pair of current mirrored transistors, the first pair of current mirrored transistors and the second pair of current mirrored transistors providing the at least one differential voltage signal;
   a first resistor coupled to the first pair of current mirrored transistors;
   a second resistor coupled to the second pair of current mirrored transistors; and
   an enabling transistor coupled to the first resistor and the second resistor, the enabling transistor for selectively enabling the first pair of current mirrored transistors and the second pair of current mirrored transistors.

9. A magnetic memory comprising:
   a plurality of magnetic storage cells, each of the plurality of magnetic storage cells including at least one magnetic element and at least one selection device, the at least one magnetic element being programmable using at least one write current driven through the magnetic element;
   a plurality of bit lines corresponding to the plurality of magnetic storage cells;
   at least one reference line for providing at least one reference signal;
   at least one sense amplifier coupled with the plurality of bit lines and the at least one reference line, the at least one sense amplifier having logic and a plurality of stages, the plurality of stages including a first stage and a second stage, the first stage for converting at least one current signal to at least one differential voltage signal and the second stage for amplifying the at least one differential voltage signal, the logic for selectively disabling at least one of the first stage and the second stage in the absence of a read operation and enabling the first stage and the second stage during the read operation, wherein the first stage further includes:

a first pair of current mirrored transistors;

a second pair of current mirrored transistors corresponding to the first pair of current mirrored transistors, the first pair of current mirrored transistors and the second pair of current mirrored transistors providing the at least one differential voltage signal;

a first transistor coupled with the first pair of current mirrored transistors and a pre-charge voltage;

a second transistor coupled with the second pair of current mirrored transistors and the pre-charge voltage; and a pre-charge circuit coupled between the inputs of first pair of current mirrored transistors and the second pair of current mirrored transistors.

10. The magnetic memory of claim 9 wherein the first stage further includes an additional transistor between inputs of the first pair of current mirrored transistors and the second pair of current mirrored transistors.

11. A magnetic memory comprising:

a plurality of magnetic storage cells, each of the plurality of magnetic storage cells including at least one magnetic element and at least one selection device, the at least one magnetic element being programmable using at least one write current driven through the magnetic element;

a plurality of bit lines corresponding to the plurality of magnetic storage cells;

at least one reference line for providing at least one reference signal;

at least one sense amplifier coupled with the plurality of bit lines and the at least one reference line, the at least one sense amplifier having logic and a plurality of stages, the plurality of stages including a first stage and a second stage, the first stage for converting at least one current signal to at least one differential voltage signal and the second stage for amplifying the at least one differential voltage signal, the logic for selectively disabling at least one of the first stage and the second stage in the absence of a read operation and enabling the first stage and the second stage during the read operation, wherein the first stage further includes:

a first pair of current mirrored transistors;

a second pair of current mirrored transistors corresponding to the first pair of current mirrored transistors, the first pair of current mirrored transistors and the second pair of current mirrored transistors providing the at least one differential voltage signal;

a first transistor coupled to the first pair of current mirrored transistors;

a second transistor coupled to the second pair of transistors; and an enabling transistor coupled to the first transistor and the second transistor, the enabling transistor for selectively enabling the first pair of current mirrored transistors and the second pair of current mirrored transistors.

12. The magnetic memory of claim 11 wherein the first stage further includes:

a first transistor coupled with the first pair of current mirrored transistors and a pre-charge voltage;

a second transistor coupled with the second pair of current mirrored transistors and the pre-charge voltage; and a pre-charge circuit coupled between the inputs of the first pair and the second pair.

13. The magnetic memory of claim 12 wherein the first stage further includes an additional transistor between inputs of the first pair of current mirrored transistors and the second pair of current mirrored transistors.

14. The magnetic memory of claim 6 wherein the pre-charge state is ground.

15. A magnetic memory comprising:

a plurality of magnetic storage cells, each of the plurality of magnetic storage cells including at least one magnetic element and at least one selection device, the at least one magnetic element being programmable using at least one write current driven through the magnetic element;

a plurality of bit lines corresponding to the plurality of magnetic storage cells;

a plurality of source lines corresponding to the plurality of magnetic storage cells;

at least one reference line for providing at least one reference signal;

a sense amplifier coupled with the plurality of bit lines and at least one reference line, the at least one sense amplifier having logic and a plurality of stages, the plurality of stages including a first stage and a second stage, the first stage for converting at least one current signal to at least one differential voltage signal and the second stage for amplifying the at least one differential voltage signal, the logic for selectively disabling at least one of the first stage and the second stage in the absence of a read operation and enabling the first stage and the second stage during the read operation, the logic including a plurality of transistor coupled between the first stage and the second stage and a plurality of transmission gates coupled between the first and second stages, the first stage including a first pair of current mirrored transistors and a second pair of current mirrored transistors coupled with the first pair of current mirrored transistors, the first pair of current mirrored transistors and the second pair of current mirrored transistors providing the differential voltage signal, the first stage also including at least one of a resistor pair and a transistor pair, the resistor pair including a first resistor coupled to the first pair of current mirrored transistors and a second resistor, substantially identical to the first resistor, coupled to the second pair of current mirrored transistors, the first stage also including an enabling transistor coupled to the first resistor and the second resistor, the enabling transistor for selectively enabling the first stage and the second stage, the transistor pair including a first transistor coupled to the first pair of current mirrored transistors and a second transistor, substantially identical to the first transistor, coupled to the second pair of current mirrored transistors, the first stage also including an enabling transistor coupled to the first transistor and the second transistor, the enabling transistor for selectively enabling the first stage and the second stage.

16. A method for providing magnetic memory comprising:

providing a plurality of magnetic storage cells, each of the plurality of magnetic storage cells including at least one magnetic element and at least one selection device, the at least one magnetic element being programmable using at least one write current driven through the magnetic element;

providing a plurality of bit lines corresponding to the plurality of magnetic storage cells;

providing at least one reference line for providing at least one reference signal providing at least one sense amplifier coupled with the plurality of bit lines and the at least one reference line, the at least one sense amplifier providing including providing logic and providing a plurality of stages, the plurality of stages providing including providing a first stage and providing a second stage, the first stage for converting at least one current signal to at least one differential voltage signal and the second stage for amplifying the at least one differential voltage signal, the logic for selectively disabling at least one of the first stage and the second stage in the absence of a read operation and enabling the first stage and the second stage during the read operation wherein the step of providing the first stage further includes providing a first stage enable input, a first output and a second output for the first stage;

wherein the step or providing the second stage further includes providing a second stage enable input, first input coupled with the first output and a second input coupled with the second output for the second stage;

wherein the step of providing the logic further includes providing a plurality of noninverting gates interleaved with a plurality of inverting gates coupled between the first stage enable input and the second stage enable input;

providing a first transistor coupled between the first output and the second output and being enabled by the first stage enable input; and providing a plurality of transistor pairs coupled between the first and second outputs and the first and second inputs.

17. The method of claim 16 wherein the logic providing further includes:

providing plurality of transistor pairs a first transistor pair including a first transistor having a first type and a second transistor having a second type different from the first type, the first transistor pair being coupled between the first output and the first input; and providing a second transistor pair including a third transistor having the first type and a fourth transistor having the second type different from the first type, the second transistor pair being coupled between the second output and the second input.

18. The method of claim 16 wherein the first stage providing further includes:

providing a first pair of current mirrored transistors;

providing a second pair of current mirrored transistors coupled with the first pair of current mirrored transistors, the first pair of current mirrored transistors and the second pair of current mirrored transistors providing the at least one differential voltage signal.

19. The providing of claim 16 wherein the second stage further includes a plurality of transistors configured as a differential voltage sense amplifier.

20. The method of claim 16 further comprising providing at a plurality of source lines coupled to the plurality magnetic storage cells;

providing at least one write driver coupled to the plurality of bit lines and the plurality of source lines, the write driver including a plurality of logic gates configured to selectively couple at least one of the plurality of bit lines to a first high voltage and at least one of the plurality of source lines to a first low voltage and to selectively the at least one of the plurality of bit lines to a second low voltage and the at least one of the plurality of source lines to a second high voltage.

21. The method of claim 16 further comprising:

Configuring the plurality of bit lines and the at least one reference line to be selectively pre-charged to a pre-charge state before the sense amplifier is enabled.

22. The method of claim 16 wherein the first stage includes a plurality of outputs, the method further comprising:

Providing a transistor coupled between the plurality of outputs, the transistor for equalizing the plurality of outputs prior to a read operation.

23. A method for providing magnetic memory comprising:

providing a plurality of magnetic storage cells, each of the plurality of magnetic storage cells including at least one magnetic element and at least one selection device, the at least one magnetic element being programmable using at least one write current driven through the magnetic element;

providing a plurality of bit lines corresponding to the plurality of magnetic storage cells;

providing at least one reference line for providing at least one reference signal providing at least one sense amplifier coupled with the plurality of bit lines and the at least one reference line, the at least one sense amplifier providing including providing logic and providing a plurality of stages, the plurality of stages providing including providing a first stage and providing a second stage, the first stage for converting at least one current signal to at least one differential voltage signal and the second stage for amplifying the at least one differential voltage signal, the logic for selectively disabling at least one of the first stage and the second stage in the absence of a read operation and enabling the first stage and the second stage during the read operation, wherein the first stage providing further includes:

providing a first pair of current mirrored transistors;

providing a second pair of current mirrored transistors coupled with the first pair of current mirrored transistors, the first pair of current mirrored transistors and the second pair of current mirrored transistors providing the at least one differential voltage signal;

providing a first resistor coupled to the first pair of current mirrored transistors;

providing a second resistor coupled to the second pair of current mirrored transistors; and providing an enabling transistor coupled to the first resistor and the second resistor, the enabling transistor for selectively enabling the first stage and the second stage.

24. A method for providing magnetic memory comprising:

providing a plurality of magnetic storage cells, each of the plurality of magnetic storage cells including at least one magnetic element and at least one selection device, the at least one magnetic element being programmable using at least one write current driven through the magnetic element;

providing a plurality of bit lines corresponding to the plurality of magnetic storage cells;

providing at least one reference line for providing at least one reference signal providing at least one sense amplifier coupled with the plurality of bit lines and the at least one reference line, the at least one sense amplifier providing including providing logic and providing a plurality of stages, the plurality of stages providing including providing a first stage and providing a second stage, the first stage for converting at least one current signal to at least one differential voltage signal and the second stage for amplifying the at least one differential voltage signal, the logic for selectively disabling at least one of the first stage and the second stage in the absence of a read operation and enabling the first stage and the second stage during the read operation, wherein the first stage providing further includes:

providing a first transistor coupled with the first pair of current mirrored transistors and a pre-charge voltage and a second transistor coupled with the second pair of current mirrored transistors and the pre-charge voltage; and providing a pre-charge circuit coupled between inputs of the first pair of current mirrored transistors and the second pair of current mirrored transistors.

25. The method of claim 24 wherein the first stage further includes an additional transistor between the inputs of the first pair of current mirrored transistors and the second pair of current mirrored transistors.

26. A method for providing magnetic memory comprising:

providing a plurality of magnetic storage cells, each of the plurality of magnetic storage cells including at least one magnetic element and at least one selection device, the at least one magnetic element being programmable using at least one write current driven through the magnetic element;

providing a plurality of bit lines corresponding to the plurality of magnetic storage cells;

providing at least one reference line for providing at least one reference signal providing at least one sense amplifier coupled with the plurality of bit lines and the at least one reference line, the at least one sense amplifier providing including providing logic and providing a plurality of stages, the plurality of stages providing including providing a first stage and providing a second stage, the first stage for converting at least one current signal to at least one differential voltage signal and the second stage for amplifying the at least one differential voltage signal, the logic for selectively disabling at least one of the first stage and the second stage in the absence of a read operation and enabling the first stage and the second stage during the read operation, wherein the first stage providing further includes:

providing a first transistor coupled to the first pair of current mirrored transistors;

providing a second transistor coupled to the second pair of current mirrored transistors; and providing an enabling transistor coupled to the first transistor and the second transistor, the enabling transistor for selectively enabling the first stage and the second stage.

27. The method of claim 26 wherein the first stage providing further includes:

providing a first transistor coupled with the first pair of current mirrored transistors and a pre-charge voltage;

providing a second transistor coupled with the second pair of current mirrored transistors and the pre-charge voltage; and providing a pre-charge circuit coupled between inputs of the first pair and the second pair.

28. The method of claim 27 wherein the first stage further includes an additional transistor between the inputs of the first pair of current mirrored transistors and the second pair of current mirrored transistors.

29. The method of claim 21 wherein the pre-charge state is ground.

30. A method for providing a magnetic memory comprising:

providing a plurality of magnetic storage cells, each of the plurality of magnetic storage cells including at least one magnetic element and at least one selection device, the at least one magnetic element being programmable using at least one write current driven through the magnetic element;

providing a plurality of bit lines corresponding to the plurality of magnetic storage cells;

providing a plurality of source lines corresponding to the plurality of magnetic storage cells;

providing at least one reference line for providing at least one reference signal;

providing at least one sense amplifier coupled with the plurality of bit lines and the at least one reference line, the at least one sense amplifier having logic and a plurality of stages, the plurality of stages including a first stage and a second stage, the first stage for converting at least one current signal to at least one differential voltage signal and the second stage for amplifying the at least one differential voltage signal, the logic for selectively disabling at least one of the first stage and the second stage in the absence of a read operation and enabling the first stage and the second stage during the read operation, the logic including a plurality of transistor coupled between the first stage and the second stage and a plurality of transmission gates coupled between the first and second stages, the first stage including a first pair of current mirrored transistors and a second pair of current mirrored transistors coupled with the first pair of current mirrored transistors, the first pair of current mirrored transistors and the second pair of current mirrored transistors providing the at least one differential voltage signal, the first stage also including at least one of a resistor pair and a transistor pair, the resistor pair including a first resistor coupled to the first pair of current mirrored transistors and a second resistor coupled to the second pair of current mirrored transistors, the first stage also including an enabling transistor coupled to the first resistor and the second resistor, the enabling transistor for selectively enabling the first stage and the second stage, the transistor pair including a first transistor coupled to the first pair of current mirrored transistors and a second transistor, substantially identical to the first transistor, coupled to the second pair of current mirrored transistors, the first stage also including an enabling transistor coupled to the first transistor and the second transistor, the enabling transistor for selectively enabling the first stage and the second stage.

* * * * *